US005508667A

United States Patent [19]
Kondratiev et al.

[11] Patent Number: 5,508,667
[45] Date of Patent: Apr. 16, 1996

[54] BALANCED BRIDGE SAW FILTER

[75] Inventors: Serguei Kondratiev, Neuchatel; Victor Plessky, Les Geneveys-sur-Coffrane, both of Switzerland

[73] Assignee: Advanced SAW Products SA, Bevaix, Switzerland

[21] Appl. No.: 280,606

[22] Filed: Jul. 26, 1994

[30] Foreign Application Priority Data

Aug. 4, 1993 [GB] United Kingdom ............... 9316118

[51] Int. Cl.$^6$ ................................................. H03H 9/64
[52] U.S. Cl. ......................... 333/194; 333/195; 333/196; 310/313 C; 310/313 D
[58] Field of Search .................................. 333/193, 194, 333/195, 196, 169; 310/313 R, 313 B, 313 C, 313 D

[56] References Cited

U.S. PATENT DOCUMENTS

| | | | |
|---|---|---|---|
| 2,922,128 | 6/1960 | Weinberg | 333/169 |
| 3,750,027 | 7/1973 | Hartmann | 333/193 X |
| 3,768,047 | 10/1973 | Campbell et al. | 333/169 X |
| 4,396,851 | 8/1983 | Kishimoto et al. | 333/194 X |
| 4,731,585 | 3/1988 | Wright | 310/313 D X |
| 4,785,270 | 11/1988 | Kinsman | 333/193 |
| 5,028,895 | 7/1991 | Fliegel | 333/193 X |
| 5,093,638 | 3/1992 | Kinsman et al. | 333/195 |

FOREIGN PATENT DOCUMENTS

| 1236809 | 9/1989 | Japan | 333/195 |
|---|---|---|---|

OTHER PUBLICATIONS

"SAW Planar Network", by Tseng et al., 1974 Ultrasonics Proceedings, pp. 282–285, 1974, New York (no month).
"800–MHz High–Performance SAW Filter Using New Resonant Configuration" by Hikita et al., IEEE Transactions On Microwave Theory and Techniques, vol. 33, No. 6, pp. 510–518, Jun. 1985.
"Miniature SAW Antenna Duplexer for 800–MHz Portable Telephone Used in Cellular Radio Systems" by Hikita et al., *IEEE Transactions On Microwave Theory And Techniques*, vol. 36, No. 6, 1988, pp. 1048–1056.

*Primary Examiner*—Benny T. Lee
*Assistant Examiner*—Justin P. Bettendorf
*Attorney, Agent, or Firm*—Perman & Green

[57] ABSTRACT

The invention relates to a SAW filter comprising a first and second pair of substantially equivalent SAW transducers electrically coupled to form a bridge circuit. Each of the transducers of the first pair of transducers have a center frequency which is slightly different to the center frequency of each of the transducers of the second pair of transducers. The product of the static capacitance of the first pair is the same as the product of the static capacitance of the second pair. In use, signals input to the filter and having a frequency within the passband of the filter are coupled to the output of the bridge circuit via one or other or both arms of the bridge, as in normal bridge circuit operation. However, out of band signals are blocked since all the transducers are equivalent capacitors having the same capacitance (i.e., static capacitance). Thus, transmission of out of band signals through the filter is inhibited by the balanced nature of the bridge.

14 Claims, 5 Drawing Sheets

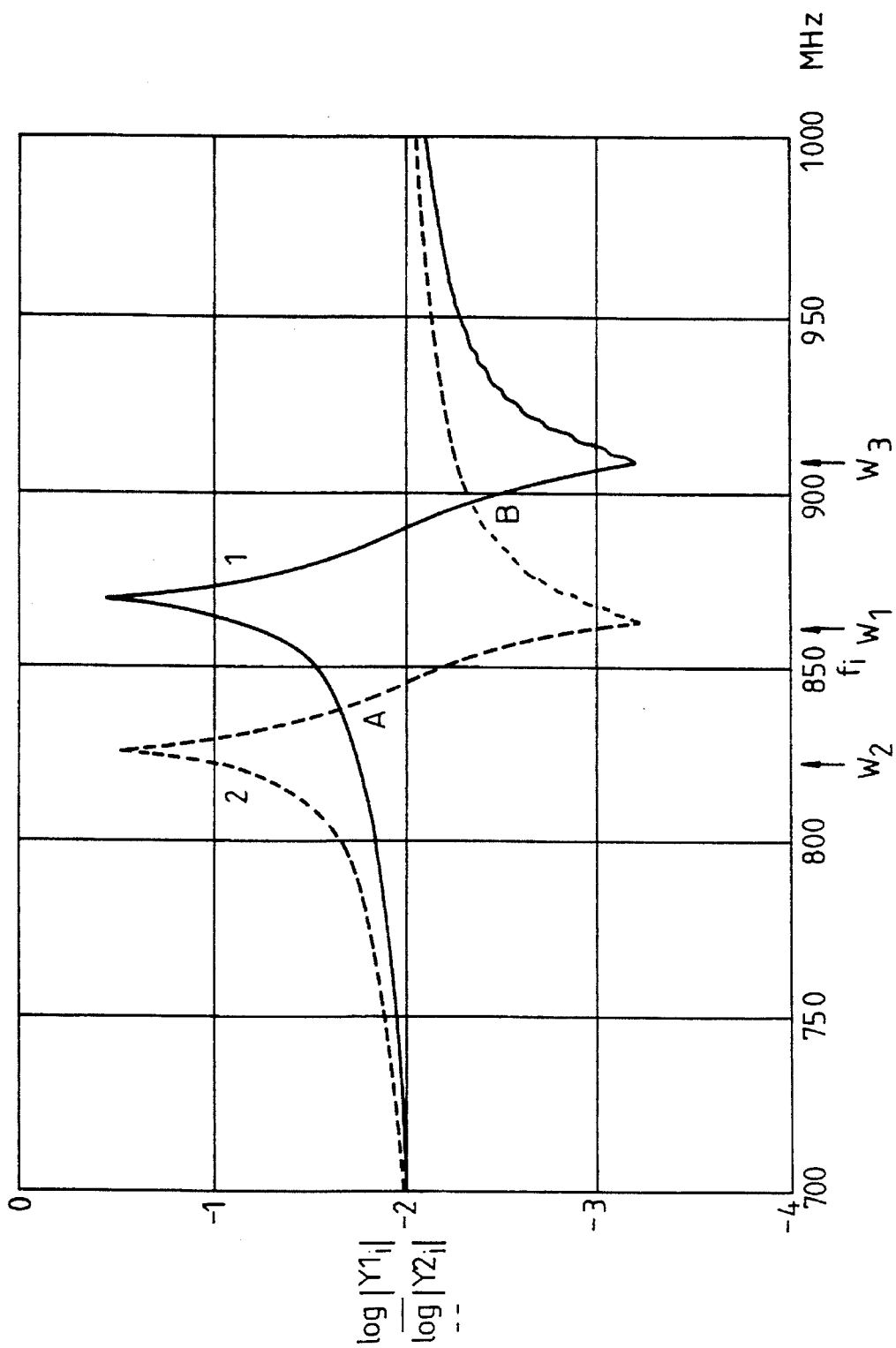

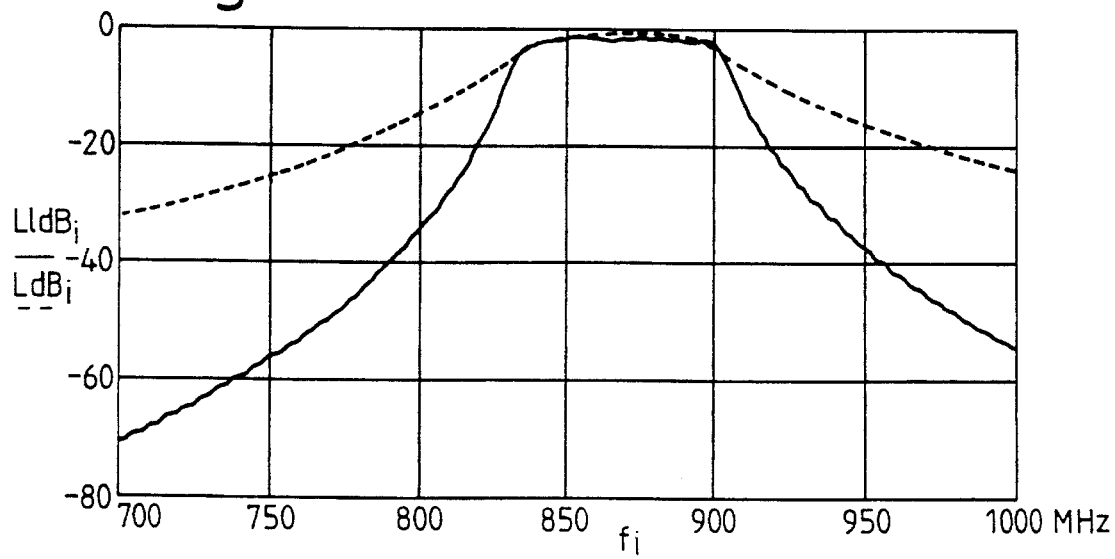
Fig. 4a
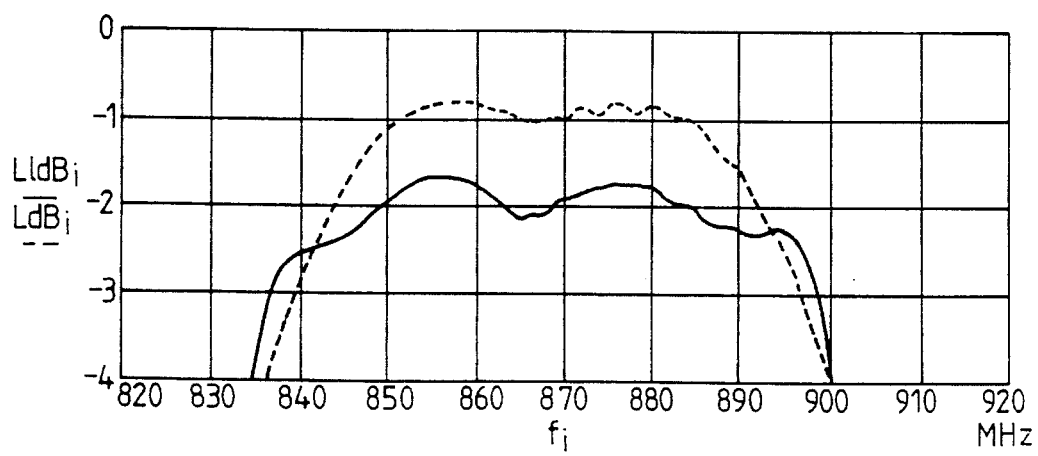
Fig. 4b
Fig. 4c

BALANCED BRIDGE SAW FILTER

FIELD OF THE INVENTION

This invention relates to a Surface Acoustic Wave (SAW) filter. In particular, it relates to a SAW filter comprising at least two pairs of SAW impedance elements electrically coupled to form a bridge circuit.

BACKGROUND OF THE INVENTION

SAW technology has found a number of applications in the electronics and RF art. Due to the fact that SAW wavelengths are typically $10^5$ times shorter than that of electromagnetic waves, SAW technology has found particular applications where miniaturization is important or desirable. One such application is the use of SAW filters in radio telephones where the typically small size and weight of SAW filters is highly advantageous over conventional technologies, such as ceramic filters, dielectric filters, and filters using magnetostatic principles. It is a requirement of such filters that they have low-loss, typically insertion losses of 1–3dB.

A typical example of a conventional SAW filter is a transversal SAW filter in which SAW energy is transferred between two spaced apart interdigital transducers (IDTs). The IDTs each comprise two sets of electrode fingers which are formed on the surface of a piezoelectric substrate. The fingers in each set are typically all electrically connected together and are interleaved (interdigitated) with the electrode fingers of the other set. In the simplest form of IDT, the spacing between adjacent fingers of a set is one acoustic wavelength i.e., one per period. However, it is possible to have more than one finger per acoustic wavelength (period), and a corresponding number on the other set. In a transversal SAW filter, electromagnetic energy is converted into SAW energy by coupling the electrostatic field pattern of an input IDT to a SAW by the piezoelectric effect. A problem with SAW filters is that their maximum input power is limited due to the mechanical vibration caused by large amplitude SAWs degrading the IDT electrode fingers resulting in lower performance from the filter. Additionally, conventional filters have relatively high losses, typically greater than 10 dB for transversal type SAW filters. Similar problems occur with SAW resonator type filters.

A known filter which addresses the problem of limited maximum input power is disclosed in an article entitled "Miniature SAW Antenna Duplexer for 800 MHz Portable Telephone Used in Cellular Radio Systems", IEEE MTT vol. 36 No 6 June 1988. The known filter utilizes electrically cascade-connected SAW IDTs of a type known as SAW resonators and conventional capacitors connected in a ladder-type scheme. In this scheme, the SAW resonators are substantially acoustically independent of each other and are conceptually modelled and used as electrical impedance elements. Modelling and using a SAW resonator as an impedance element is possible because a SAW element such as a SAW resonator has an electrical impedance which is, in part, dependent on the electro-acoustic interaction of the electrode fingers of the SAW resonator with the mechanical vibration of the SAW. Near to the center frequency of the SAW elements (i.e., the frequency at which the separation of adjacent fingers is $\lambda/2$) it has a maximum electrical admittance and a minimum electrical admittance. These are respectively the electrical resonant and anti-resonant frequencies of the SAW element. When large changes in electrical impedance are desired, the electro-acoustic interaction must be high. Thus, SAW elements with a large number of electrode finger pairs are used. Conventional SAW resonators having reflectors at both ends of a transducer and a large number of electrode pairs can be used, or alternatively transducers having just a large number of finger pairs can be used. Since the SAW resonators in the known filter are being utilised primarily as lumped impedances, it is convenient to term them SAW impedance elements. The term SAW impedance elements will hereinafter be used when referring to any SAW element (IDT, SAW resonator or otherwise) which is being used in at least part for its electrical impedance properties. In the foregoing the individual SAW resonators can be modelled as lumped impedance elements connected in series, and a conventional capacitance (static capacitance $C_{STot}$) connected in parallel between ground and a port of a SAW resonator. The static capacitance is due to the capacitance between electrodes of the SAW resonators, between electrodes of the SAW resonators and ground, and the resonator to resonator coupling pattern and ground.

The known filter can operate at high powers because in the passband of the filter, i.e., in the region of the SAW resonator center frequency, most of the signal energy is transferred electrically through the resonators. Thus, there is very little degradation of the electrode fingers. Although the above described filter addresses the problem of limited maximum input power, the out of band insertion losses are typically 20–25 dB which are not sufficient for many applications. Such low insertion losses are due to the static capacitance transmitting a significant proportion of energy in the out of band frequecy range through the filter, since out of band the filter acts as a capacitative ladder.

SUMMARY OF THE INVENTION

In accordance with the present invention there is provided a SAW filter comprising a first pair and a second pair of SAW impedance elements electrically coupled to form a bridge circuit, wherein a center frequency of each SAW impedance element of the first pair of SAW impedance elements is different to a center frequency of each SAW impedance element of the second pair of SAW impedance elements, and the product of the static impedance of the SAW impedance elements of the first pair is substantially equivalent to the product of the static impedance of the SAW impedance elements of the second pair.

The advantage of the present invention is that the voltages transmitted from the input to the output due to static capacitances are cancelled, thereby reducing out of band transmission. A further advantage of the invention is that very little acoustic power is generated in the impedance element and therefore it can handle high input power levels. Furthermore, the phase relationship between the electrode fingers becomes non-critical. Thus, the impedance elements can be simple, well known periodic structures which reduces the complexity of the masks used in manufacturing the electrode structures and increases the percentage tolerances during the manufacturing process. Additionally, because very little acoustic power is produced the impedance elements do not interact acoustically, which is the converse of resonator filters for example in which frequency characteristics are determined by a fine phase balance between reflected waves. Thus, each impedance element can be a simple SAW transducer or one-port resonator and can be placed close to other such elements whilst remaining acoustically independent of them. Contrary to conventional resonator filters, the frequency characteristics of a filter comprising such impedance elements are determined by the electrical network formed by the impedance elements. This aids miniaturization of the filter and reduces the complexity of the circuit since the need for acoustic absorbers is reduced. Thus, instead of very complicated SAW devices such as coupled resonator filters which are difficult to design and have low production yields, simple and reliable SAW devices can be fabricated which have improved frequency characteristics and power-handling.

By designing the filter such that the static impedance of each SAW impedance element of the first and second pair of SAW impedance elements are substantially equivalent, it would be possible to use the same mask for each element of a pair of SAW elements.

In a preferred embodiment of the invention, the fractional difference between the center frequency of each SAW impedance element of the first pair of SAW impedance elements and the center frequency of each SAW impedance element of the second pair of SAW impedance elements is substantially half the electro-mechanical coupling coefficient $K^2$ of the substrate. Such a preferred embodiment has the advantage that the bandwidth of the filter can be determined by a suitable choice of substrate material, since the parameter $K^2$ determines the maximum achievable passband with low loss.

Preferably, each impedance element has at least $2/K^2$ electrode finger pairs. This has the advantage that there is a large change in the electrical impedance of respective SAW impedance elements near to their respective center frequencies. Each transducer of the first and second pair of impedance elements have respective electrode finger widths of substantially quarter of the acoustic wavelength of the center frequency of respective impedance elements. Such an embodiment has the advantage that the electrode fingers are relatively wide and thus high frequency filters (~2 GHz) can be constructed, without reducing the percentage tolerances during the manufacturing process to an unacceptable level. Such an embodiment should be compared with other types of low loss SAW filters wherein the electrode fingers are typically $\lambda/8$ or $\lambda/16$ in order to get low loss performance. In such filters, the maximum frequency is limited by the resolution of the lithographic process used to produce the SAW filters.

Suitably, the SAW transducers can be configured as simple SAW interdigital transducers (IDT), SAW resonators or SAW resonator-type structures. Such embodiments have the advantage that well known transducer patterns can be utilized in the invention, thereby simplifying the design of a filter comprising the invention. Furthermore, particularly narrow band filters can be constructed using SAW resonators as impedance element structures.

Advantageously, apodized interdigital electrode structures can be used in the invention to optimise the filter characteristics, e.g., reduce ripple in the passband or to produce a narrowband filter.

Two or more filters having impedance elements arranged in conformity with any of the aforementioned embodiments can be electrically cascade-coupled to each other to form a composite filter. Such an arrangement can be configured so that the center frequencies of a pair of impedance elements in one filter corresponding to a pair of impedance elements in another filter are optimised to suppress ripples in the passband of the composite filter due to the corresponding pair of impedance elements in the other filter. Furthermore, such a composite filter can be configured such that its shape factor is improved relative to a single bridge filter.

It will be clear to a person skilled in the art that a two-port SAW device, e.g., interdigitated IDT, can be cascaded with the balanced bridge filter in order to perform functions such as that of an acoustic transformer.

For the sake of clarity and completeness it should be noted that the term SAW includes other types of waves similar to conventional surface acoustic waves, such as surface skimming bulk waves (SSBWs), leaky waves and surface transverse waves (STWs), and references to SAWs throughout the specification include references to such similar waves or the like.

BRIEF DESCRIPTION OF THE DRAWINGS

FIG. 3 shows a graph of admittance against frequency for two transducers with slightly different center frequency;

FIGS. 4a, 4b and 4c show transmission amplitude against frequency for a one section bridge filter (dotted) and a two section bridge filter (solid)

DESCRIPTION OF EMBODIMENTS OF THE INVENTION

Embodiments of the invention will now be described, by way of example only, and with reference to the drawings.

Figure 1A:
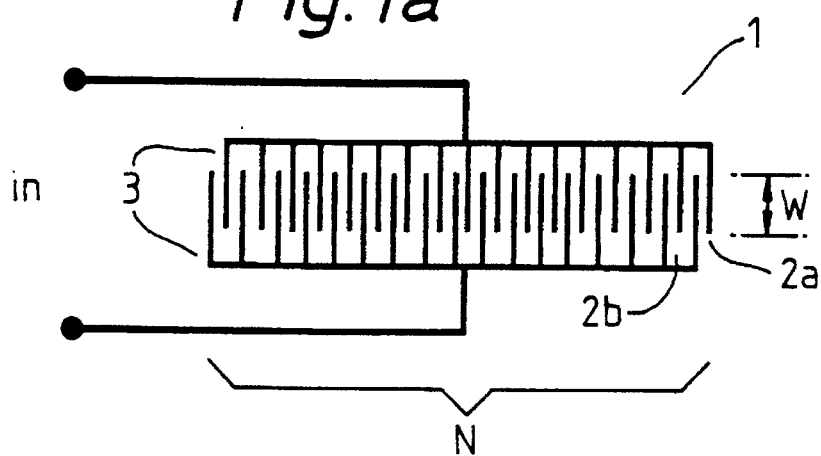
FIG. 1 shows a) a typical SAW IDT electrode structure, and b) an equivalent circuit of such an electrode structure.
Figure 1B:
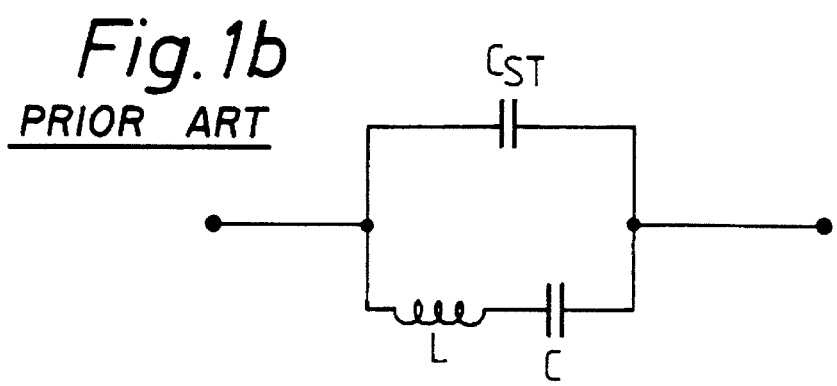

FIG. 1a shows a schematic layout diagram of a typical SAW transducer 1. Adjacent fingers 2a and 2b comprise finger-pairs and are generally half of an acoustic wavelength ($\lambda_{ac}$) apart. The electrode fingers 2a, 2b are coupled to bus bars 3, which form an electric port of the SAW transducer. The overlap (W) between the fingers defines the aperture of the transducer and N is the number of finger pairs. Such a SAW transducer has an equivalent circuit as shown in FIG. 1 (b). The static capacitance $C_{STot}$ is due to the capacitance between adjacent fingers 2a, 2b, the bus bars and coupling leads. The series L-C circuit represents the electrical behaviour of the transducer 1 near to its center frequency $\omega_o$. The applicant has found that the best results are achieved with SAW transducers having reflectors 4 disposed at each end (see FIG. 2).

Figure 2:
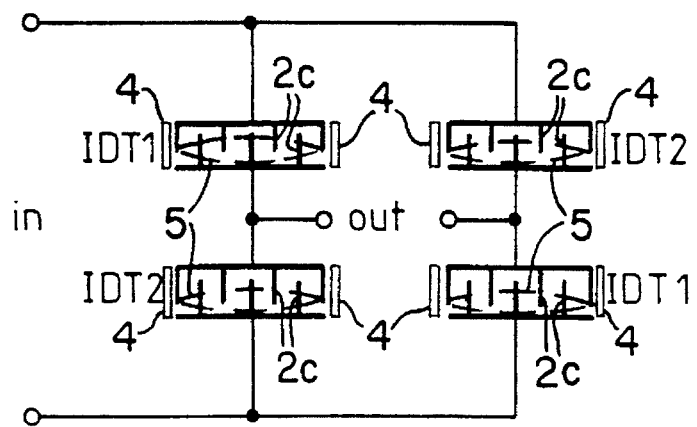
FIG. 2 shows a schematic layout diagram of a SAW balanced bridge filter.

A schematic layout diagram of an embodiment of the invention is shown in FIG. 2. IDT1 and IDT2 are one of each pair of identical transducers and are arranged in a conventional electrical bridge circuit configuration. Conforming to our earlier terminology The transducers ! DT1 and IDT2 will be referred to as impedance elements. The impedance elements IDT1 and IDT2 can be formed integrally with each other. The number N of electrodes 26 in each impedance element is chosen such that $N>(\Delta V/V)^{-1}$, where $(\Delta V/V)$ is the ratio of the difference between the short circuit SAW velocity and the open circuit SAW velocity, and is related to the electro-mechanical coupling parameter K by the equation $K^2=2*(\Delta V/V)$. N is limited by the size of the substrate upon which the bridge filter is to be supported and the desire to reduce so-called second order effects including the diffraction of acoustic beams in long structures; the attenuation of the SAWs; and the finite resistance of the electrodes.

Additionally, the electrode aperture W and the number of electrodes satisfy the condition $$\omega C_{ST} W N > \max^m (r_{in}, r_{out})^{-1}$$

where $\omega$ is the center frequency of the impedance element, $C_{ST}$ is the static capacitance per unit length electrode and $r_{in}$, $r_{out}$ are respectively input and output loads of the bridge filter, and $\max^m$ indicates the maximum value within the brackets following that operator. Preferably, $$\omega C_{ST} W N \cong (r_{in} \times r_{out})^{-1/2},$$

which condition results in reduced mismatch loss.

It is an important element of the bridge filter circuit that the center frequencies of the two pairs of impedance elements are different. The center frequency of an impedance element is determined by the periodicity (p) of its electrodes. In this embodiment the difference between the periods defines the difference between the center frequencies and satisfies the following relationship:

$$\frac{1}{2} \frac{\Delta V}{V} \leq \frac{p_1 - p_2}{p_{av}} \leq \frac{3}{2} \frac{\Delta V}{V},$$

where $p_1$, $p_2$ and $p_{av}$ are respectively the periodicity of the electrodes in the first and second IDT and their average value. The fractional difference between the center frequency of each impedance element is given in terms of the periodicity of the electrodes in respective impedance elements in the above equation. This can be rewritten in the form $$\frac{f_1 - f_2}{f_{av}} \equiv \frac{K^2}{2} = \frac{\Delta V}{V},$$

where $f_1$ is the center frequency for IDT1, $f_2$ is the center frequency for IDT2 and $f_{av}$ is the average center frequency. The best results as to low losses and low ripple in the passband of the bridge filter are obtained if the difference between the periods ($p_1-p_2$) is chosen so that the maximum admittance of one pair of impedance elements at the same frequency as the minimum of another pair. The total static capacitance of each impedance element is given by $NC_{ST}W$, and it is a simple matter to design impedance elements IDT1 and IDT2 such that they have substantially equal static capacitances. Optionally, the product of the static capacitance $C_{STot}$ of the pair of impedance elements of IDT1, and the products of the static capacitance $C_{STot}$ of the pair of impedance element IDT2 are substantially equal and fulfill the following condition, IDT1 (left side)×IDT1 (right side)≅IDT2 (left side)×IDT2 (right side)

where left and right sides refer to the position of the IDTs in FIG. 2.

Thus, respective impedance elements of each pair of impedance elements IDT1 and IDT2 may have different total static capacitances providing the foregoing relationship holds.

In some cases, for example, for narrow-band devices it can be of advantage, to use other possibilities to shift the resonance frequency. This shift can be achieved using:

a) change of mark/space ratio in element 2 compared to element 1 b) to change simultaneously the apertures and number of electrodes c) introducing gaps of different width between the transducer and reflector and/or gaps inside the IDT d) changing the number of reflectors (which can be useful also for correcting the form of the device characteristic).

The combinations of proposed means are possible. This has the advantage that small changes in frequency are possible and that the parasitic capacitances of all the IDTs can be made the same, although the IDTs have different resonant frequencies.

FIG. 3 shows a graph of the absolute value of admittance versus frequency for two different IDTs, conforming to the foregoing criteria, and supported on a 64-LiNbO$_3$ substrate. The positions of the two peaks of magnitude of electrical admittance are chosen to give a desired filter bandwidth.

In the present embodiment the difference between the center frequencies of IDT1 and IDT2 has been chosen such that their respective admittance curves intersect at an admittance corresponding to the input and output loads of the bridge filter. Of course, the input and output loads may not necessarily be equal.

In a circuit in which the input and output loads are not equal ($r_{in} \neq r_{out}$), insertion loss can be reduced by designing the bridge filter to appropriately transform $r_{in}$, $r_{out}$ in order to match the input and output loads. However, if $r_{in}$ and $r_{out}$ are greatly different mismatch losses are inevitable.

Typically, the piezoelectric substrate and the design of the impedance elements is chosen such that the peak magnitude of the IDT admittances is 10 to 100 times greater than that due to the static capacitance of the IDT's. The higher this ratio the lower the insertion loss which can be achieved.

It would be straight forward for a person skilled in the art to meet these design criteria by an appropriate choice of substrate material, periodicity of and number of finger pairs N and aperture W, for a desired IDT center frequency.

The bridge filter operates in the following fashion. When a signal having a frequency outside of the passband of the bridge filter is applied to the inputs of the bridge filter, the signal is split between the two arms of the filter. Since the static capacitances of transducers IDT1 and IDT2 are equal the signal is split equally between the arms of the bridge filter and zero signal is seen at the output of the filter. Thus, for out of band signals the effects of static capacitance are balanced out and there is low transmission through the filter.

However, if the frequency of an input signal is in the passband the admittance of transducers IDT1 and IDT2 are different (due to SAW generation) and thus the input signal sees a different admittance sequence in each arm of the bridge. Referring to FIG. 3, the electrical anti-resonance frequency of IDT2 occurs at approximately the same frequency as the electrical resonant frequency of IDT1 and the bridge is strongly imbalanced. At electrical anti-resonance the electrical admittance of the IDTs is low, therefore a signal having a frequency $\omega_1$ corresponding to an electrical anti-resonance of IDT2 would see a low electrical admittance. However, $\omega_1$ is the electrical resonant frequency of IDT1 and therefore the signal would see a high electrical admittance in the arm containing IDT1 and the signal would pass through the arms containing impedance elements IDT1 to the output of the filter. At the resonant frequency $\omega_2$ of IDT2, or the anti-resonant frequency $\omega_3$ of IDT1 the bridge is also strongly imbalanced, since one pair of arms has a lower impedance than the other. However, contrary to the situation when the frequency is $\omega_1$, at these frequencies one of the arms has an impedance close to the input and/or output loads $r_{in}$, $r_{out}$. Thus, some losses appear at these frequencies. Therefore, the maximum passband is limited by frequencies $\omega_2$ and $\omega_3$, and the lowest losses can be obtained in the frequency range lying between the intersection points of admittance curves 1 and 2 (marked A and B on FIG. 3).

In the passband of the bridge filter, the electrical admittance of one pair of IDTs is very high in comparison with the input-output admittance of the bridge filter near to the electrical resonant frequency of the one pair of IDTs. That means that only a small part of the input signal voltage is applied to the IDTs. (The voltage is shared between input, output and network elements roughly proportional to the impedances). The transfer of energy from the input to the output in this case substantially takes place in the form of electrical energy as in conventional networks and transmission lines.

At rejection points, the admittance of the impedance elements transducers is low and the current in the bridge circuit is low. Thus energy flow everywhere including in the SAW elements is low. Finally, in the stop band range of frequencies SAWs are not excited, because of the absence of wave synchronism, and the impedance elements are solely capacitive.

Due to the fact that near to the resonant frequency of the IDTs almost all the signal energy is electrically transmitted through the IDTs, there is very little SAW generation and the mechanical vibration of electrode fingers is very small. Thus, it is possible to use the bridge filter at high signal powers without degrading the electrode structure.

In FIG. 4, the dotted line shows insertion loss against frequency for a single bridge filter circuit. This bridge circuit utilises two pairs of IDTs each having ≈150 pairs of single electrodes with an aperture of ≈25 μm and a period ≈5 μm. As can be seen from FIG. 4 a), the passband has a relatively poor shape factor. FIG. 4 b) shows a magnified view of the passband shown in FIG. 4 a), which shows the high degree of ripple present in the passband. The foregoing filter characteristics can be improved by cascading individual bridge filters, thereby forming a composite filter comprising bridge filter sections. In particular, ripples in the passband of the filter can be decreased by shifting the center frequencies of corresponding impedance elements in a neighbouring filter section of such a composite filter. Such frequency shifting is determined by small differences between the periods of corresponding impedance elements $$\frac{\Delta p}{p_{av}} \sim 0.5 \frac{\Delta f}{f_{av}}$$

where $\Delta f$ is the period of the ripples in the passband in one of the individual bridge circuits and $f_{av}$ and $p_{av}$ are respectively the average frequency and average periodicity in one of the individual bridge circuits.

In FIG. 4 the solid line shows the frequency characteristic of a filter having two bridge filter sections connected in series and having small differences in the center frequencies of corresponding pairs of impedance elements to suppress ripples in the passband. As can be seen from the solid line the shape factor of the composite filter characteristic has been improved with respect to that of a single bridge filter, and the edges of the passband are much sharper.

Figure 5A:
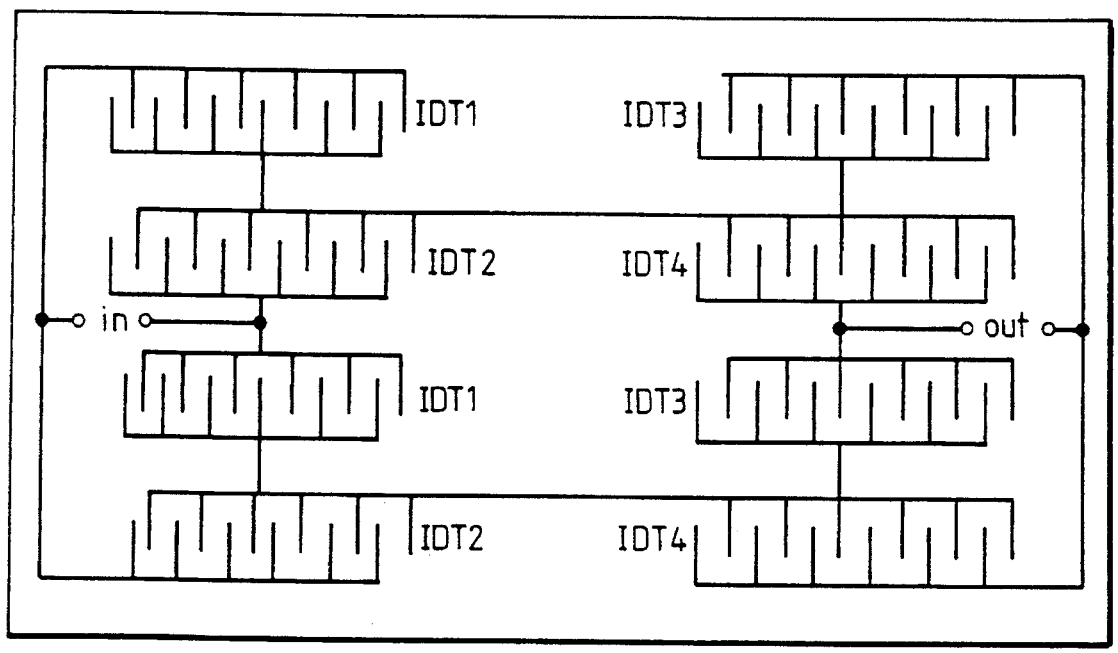
FIGS. 5a and 5b show schematic layout arrangement for composite bridge filters comprising two individual bridge filters.
Figure 5B:
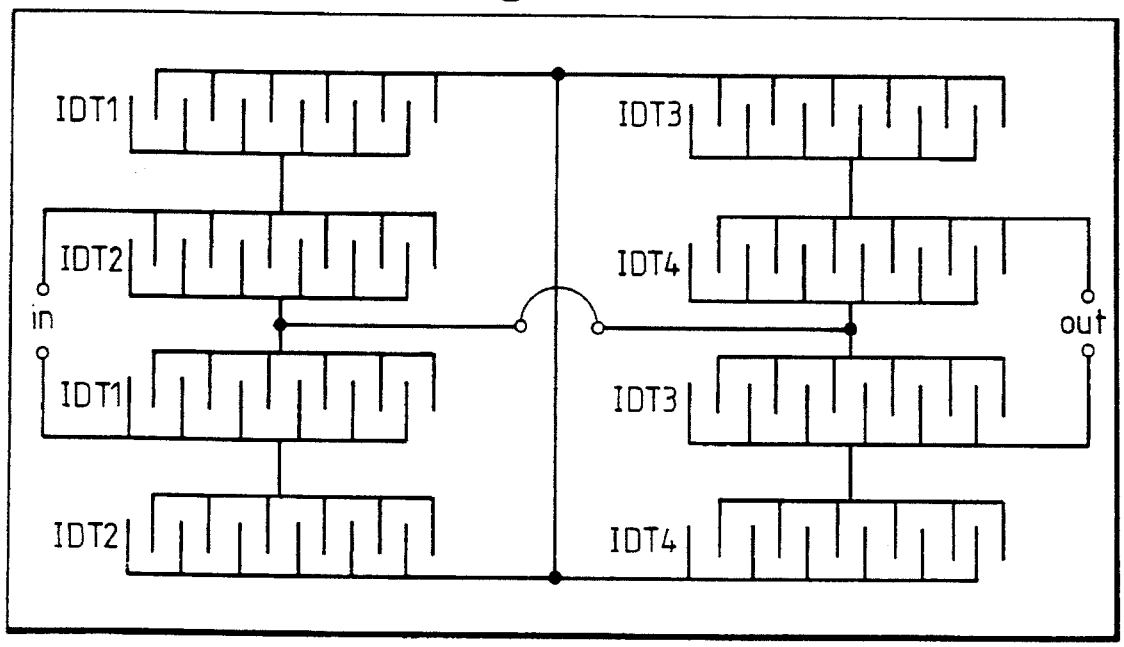

FIG. 5, shows typical schematic topological layouts that could be employed to fabricate a filter comprising two cascaded bridge filters. To avoid the reception of SAW by one impedance element generated by another impedance element acoustic absorbers can be placed between impedance elements. Alternatively, the impedance elements can be disposed relative to each other such that they are in different acoustic channels.

Figure 6:
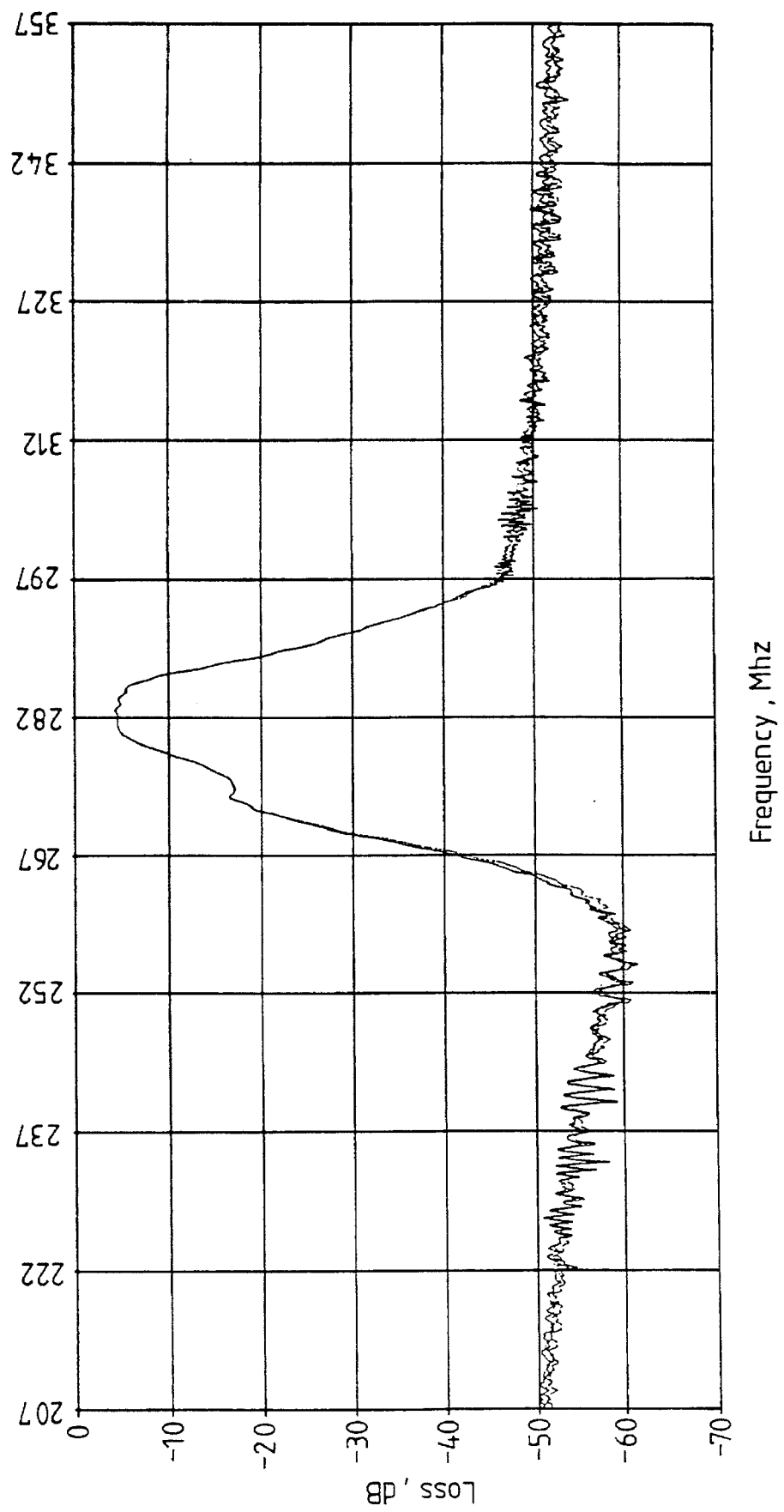
FIG. 6 shows the transmission characteristic for three nominally identical balanced bridge filters comprising two sections.

The reproducibility and reliability of manufacture of a filter designed and fabricated according to the present invention is exemplified by FIG. 6. FIG. 6 shows the transmission characteristics for three nominally identical balanced bridge filter circuits fabricated on 64° $LiNbO_3$ and having two pairs of substantially equivalent impedance elements (transducers). Each of the first pair of impedance elements have a center wavelength of 16.32 μm and 4 electrode fingers per period, finger-overlap width (aperture) of 7.35λ, and a length of 195λ. Each of the second pair of impedance elements have a center wavelength of 16.00 μm, 4 electrodes per period, finger overlap width (aperture) of 7.50λ and length of 207λ.

The difference in length between the transducers comprising the two pairs was a design error and manifests itself in the relatively low level of suppression (−50 dB) in the stopband of the transmission characteristic shown in FIG. 6.

As can be seen from FIG. 6 it is almost impossible to discern more than one line, which indicates that the 3 filters operate in almost identical fashion and thus the manufacture of filters according to the present invention appears to be highly reproducible and reliable. FIG. 6 further shows that the insertion loss is ~4dB and the attenuation in the stop band is ~45dB. It is expected that new filters having the design error rectified would have stop band loss of ~70dB.

It will be clear to a person skilled in the art, that variations and modifications may be made to the invention. For example, the impedance element may be of a SAW resonator type which would enable narrowband filters to be fabricated. Alternatively, interdigitated interdigital transducers may be used. Additionally, apodized transducers may be used to further suppress ripples in the passband and for designing narrowband devices. Apodized transducers comprise electrodes of varying length. For example, electrodes 2c shown in FIG. 2 may follow the profile of dotted line 5 to form the apodized transducers.

In view of the foregoing description it will be evident to a person skilled in the art that various modifications may be made within the scope of the invention. In particular, the term SAW includes other types of waves similar to conventional surface acoustic waves, such as surface skimming bulk waves (SSBWs), leaky waves and surface transverse waves (STWs).

The scope of the present disclosure includes any novel feature or combination of features disclosed therein either explicitly or implicitly or any generalisation thereof irrespective of whether or not it related to the claimed invention or mitigates any or all of the problems addressed by the present invention. The applicant hereby gives notice that new claims may be formulated to such features during the prosecution of this application or of any such further application derived therefrom.

We claim:

1. A SAW filter comprising a first pair and a second pair of SAW impedance elements electrically coupled to form a bridge circuit, wherein a center frequency of each SAW impedance element of the first pair of SAW impedance elements is different to a center frequency of each SAW impedance element of the second pair of SAW impedance elements, and a product of a static capacitance of the SAW impedance elements of the first pair is substantially equivalent to a product of a static capacitance of the SAW impedance elements of the second pair such that the static capacitances of the respective pairs of SAW impedance elements are balanced.

2. A SAW filter according to claim 1, wherein the static capacitance of each SAW impedance element of the first and second pair of SAW impedance elements are substantially equivalent.

3. A SAW filter according to claim 1, wherein the fractional difference between the center frequency of each SAW impedance element of the first pair of impedance elements and the center frequency of each SAW impedance element of the second pair of impedance elements is substantially half the electro-mechanical coupling coefficient $K^2$ of the substrate.

4. A SAW filter according to claim 1, wherein each SAW impedance element of the first pair of SAW impedance elements has an impedance maximum at substantially the same frequency as each SAW impedance element of the second pair of SAW impedance elements has an impedance minimum.

5. A SAW filter according to claim 1, wherein each impedance element has at least $2/K^2$ electrode finger pairs.

6. A SAW filter according to claim 1, wherein the SAW impedance elements of the first and second pair of SAW impedance elements have respective electrode finger widths of substantially quarter of the acoustic wavelength of the center frequency of respective SAW impedance elements.

7. A SAW filter according to claim 1, wherein the first and second pair of SAW impedance elements comprise interdigital transducers.

8. A SAW filter according to claim 1, wherein the first and second pair of SAW impedance elements comprise SAW resonator-type structures.

9. A SAW filter according to claim 1, comprising apodized SAW impedance elements.

10. A filter according to claim 1, wherein the SAW impedance elements are formed integrally with each other.

11. A SAW filter according to claim 1, wherein the difference between the center frequency of each SAW impedance element of the first pair of SAW impedance elements and the center frequency of each SAW impedance element of the second pair of SAW impedance elements is obtainable by having a) different metallisation mark-space ratios between respective pairs of impedance elements, or b) different apertures and number of electrodes between respective pairs of impedance elements, or c) different sized gaps between transduction elements and reflecting elements between respective pairs of impedance elements, or d) different numbers of reflecting elements.

12. A composite SAW filter comprising at least two SAW filters, at least one of the SAW filters comprising:

a first pair of SAW impedance elements; and a second pair of SAW impedance elements electrically coupled to the first pair of SAW impedance elements to form a bridge circuit, wherein a center frequency of each SAW impedance element of the first pair of SAW impedance elements is different to a center frequency of each SAW impedance element of the second pair of SAW impedance elements, and a product of a static capacitance of the SAW impedance elements of the first pair is substantially equivalent to a product of a static capacitance of the SAW impedance elements of the second pair;

wherein the at least two SAW filters are electrically cascade coupled in series.

13. A composite SAW filter according to claim 12, wherein one of the two or more SAW filters is adapted to inhibit ripples in the passband of the composite SAW filter caused by another one of the two or more SAW filters.

14. A radio telephone having a saw filter, the saw filter comprising:

a first pair of SAW impedance elements; and a second pair of SAW impedance elements electrically coupled to the first pair of SAW impedance elements to form a bridge circuit, wherein a center frequency of each SAW impedance element of the first pair of SAW impedance elements is different to a center frequency of each SAW impedance element of the second pair of SAW impedance elements, and a product of a static capacitance of the SAW impedance elements of the first pair is substantially equivalent to a product of a static capacitance of the SAW impedance elements of the second pair such that the static capacitances of the respective pairs of SAW impedance elements are balanced.

* * * * *